United States Patent [19]
Collet et al.

[11] 4,161,741
[45] Jul. 17, 1979

[54] SEMICONDUCTOR MEMORY DEVICE

[75] Inventors: Marnix G. Collet, Eindhoven, Netherlands; Roelof H. W. Salters; Joannes J. M. Koomen, both of Sunnyvale, Calif.

[73] Assignee: U.S. Philips Corporation, New York, N.Y.

[21] Appl. No.: 814,650

[22] Filed: Jul. 11, 1977

[30] Foreign Application Priority Data

Feb. 4, 1977 [NL] Netherlands ............... 7701172

[51] Int. Cl.² ................................ H01L 27/02
[52] U.S. Cl. ............................. 357/41; 357/42; 357/46; 357/59; 357/45
[58] Field of Search ................ 357/41, 42, 45, 46, 357/59

[56] References Cited

U.S. PATENT DOCUMENTS

| | | | |
|---|---|---|---|
| 4,063,274 | 12/1977 | Dingwall | 357/42 |
| 4,085,498 | 4/1978 | Rideout | 357/42 |

*Primary Examiner*—Edward J. Wojciechowicz
*Attorney, Agent, or Firm*—Thomas A. Briody; Edward J. Connors, Jr.; Jerry A. Dinardo

[57] ABSTRACT

The invention relates to a JFET memory in which the information at the gate electrodes of the JFET's is stored and read-out non-destructively. Each JFET has an IGFET structure situated entirely within the JFET and the gate of which is coupled to the source or drain of the JFET. The information can be refreshed periodically at cell level (that is without external amplifiers) by means of said IGFET.

25 Claims, 26 Drawing Figures

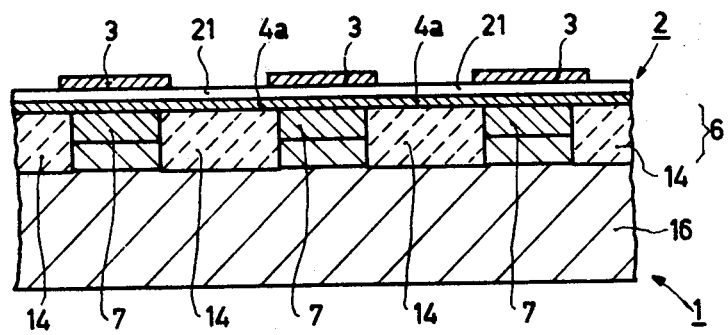
Fig. 3
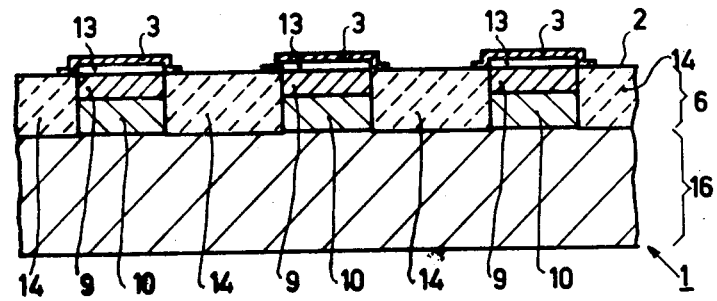
Fig. 4
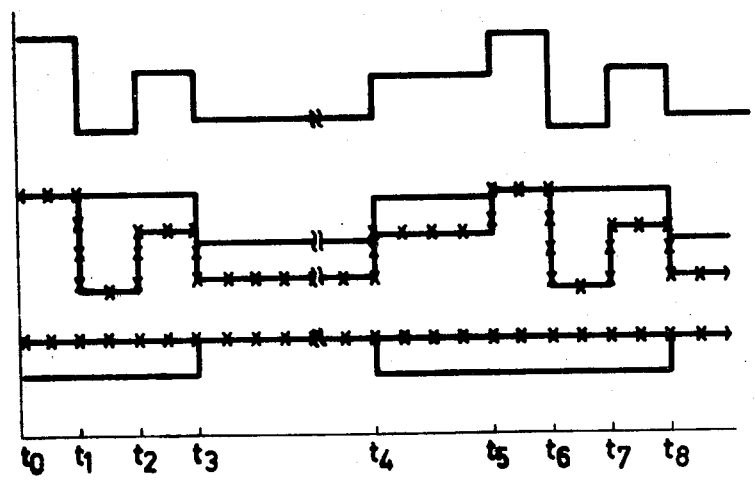
Fig. 5
Fig. 6
Fig. 7
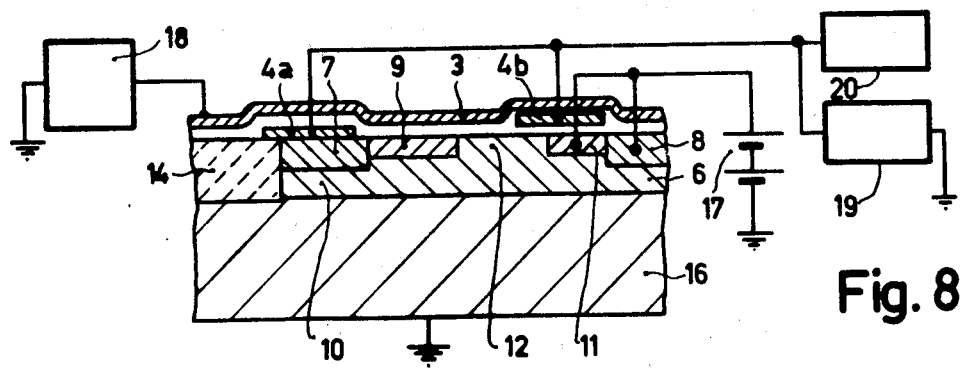
Fig. 8

SEMICONDUCTOR MEMORY DEVICE

The invention relates to a semiconductor device having a semiconductor memory element in particular suitable for use in a random access memory, comprising a semiconductor body having a surface-adjoining surface region of mainly one conductivity type and having a field effect transistor, hereinafter referred to as first field effect transistor, which comprises two main electrode regions of one conductivity type with therebetween a channel region of one conductivity type and a surface-situated gate region by means of which a depletion region extending at least into the channel region can be induced in the semiconductor body which forms a charge storage region in which information can be stored in the form of electrical charge, which information can be read-out non-destructively by determining the conductance in the channel region between the main electrode regions.

The invention relates in particular to a semiconductor device comprising a random access memory having a semiconductor body which is provided at a surface with a system of conductors of word lines and bit lines which, at the area of the crossings, are coupled electrically to memory elements provided in an underlying surface region of the semiconductor body of mainly one conductivity type which each comprise a field effect transistor, hereinafter referred to as first field effect transistor, having two main electrode regions of one conductivity type and an intermediately located channel region of one conductivity type and having a gate region which is situated near the surface and by means of which a depletion region extending in the channel region can be formed in the semiconductor body which forms a charge storage region in which information in the form of electrical charge can be stored, which information can be read non-destructively, the bit lines being coupled to a first main electrode region of the field effect transistors and the word lines being coupled to a gate region of the first field effect transistors.

Memories having random access, in literature usually referred to by RAM (an abbreviation of *Random Access Memories*), in which the information is stored in the form of discrete packets of electrical charge are generally known. The information is usually stored in regions of the semiconductor body which can be addressed via a switching member, for example a field effect transistor, which is connected to the said region in some way or another.

Because the number of cells in a RAM can be very large—for example, may be many thousands—it is desired for each cell to be as small as possible. Therefore, only one transistor is preferably used per cell. In a generally known embodiment such a cell is formed by an insulated gate field effect transistor and by an associated capacitor connected to one of the main electrode regions. The information is stored in the capacitor in the form of charge which, by opening the transistor, can be transported to the other main electrode region and a reading-out member connected thereto.

For reading-out the cell a very sensitive amplifier is usually required because the output signals, in particular as a result of very great stray capacitances, are generally very weak. For a word line-organized memory this means that an individual amplifier is necessary per bit line. Because in addition the reading-out takes place destructively, the information has to be written again after each reading-out cycle. The writing again of the information can be carried out by means of the said amplifiers; in the same manner, the information which may disappear gradually as a result of leakage currents, can be refreshed periodically.

Devices of the kind described in the preamble in which the information is stored in a depletion region in or near the gate region of a field effect transistor and therefore controls the conductance in the channel region are distinguised from the above-described devices in particular by the possibility of non-destructive reading-out. As a result of this, a great (charge) amplification can be obtained upon reading-out, so that extra amplifications at the bit line are generally not necessary. In addition, the stored information can be read-out several times in succession without having to be written again after each individual reading-out cycle.

In this type of memory devices the field effect transistors may be formed, for example, by so-called junction field effect transistors or JFET's, in which the gate region which controls the conductivity through the channel region is separated from the channel region by a rectifying junction, for example a p-n junction. Memories constructed from this type of elements are described inter alia in the article by Raymond A. Heald and David A. Hodges entitled "Multilevel Random Access Memory Using One Transistor Per Cell" and published in IEEE Journal of Solid State Circuits, Vol. SC11, No. 4, August 1976, pages 519/528. The information is stored on an electrically floating gate region which is reversely biased. The depletion region extending in the gate region and in the channel region and the size of which is determined by the charge state of the gate region, determines the resistance of the channel region. The charge state can be read-out by measuring the resistance in the channel region.

Instead of junction field effect transistors, deep-depletion field effect structures may also be used for the present purpose, in which the gate region is not separated from the channel region by a p-n junction but by an insulating layer and is formed by a conductor which is provided on the insulating layer and by means of which a depletion region is induced in the underlying channel region. Charge information can be stored in said depletion regions in the same manner as in charge-coupled devices, can determine the size of the depletion region, and can hence control the conductivity in the channel region of the field effect transistor in the same manner as described above for junction field effect transistors.

As already noted, it is not necessary in memory devices of the type to which the present invention relates to write the information again after each reading-out operation, due to the non-destructive character of the reading-out. The period during which the information is retained is determined by leakage currents. The value of the leakage currents in the charge storage regions is determined in particular by the concentration of generation centres in the semiconductor body or at least in the depletion region forming the charge storage region. The leakage currents can generally be kept so small that the time intervals within which the information can disappear by leakage are so large that it is not necessary for many applications to refresh the information intermediately. As stated in the above-mentioned publication, leakage currents can be kept small in particular when the zone which forms the gate region of the transistor is buried entirely in the semiconductor body because in most of the cases the concentration of generation centres in the bulk of the semiconductor body is very small or is at least much smaller than the concentration of surface centres.

In a great number of applications, however, it is desirable for the stored information to be retained for longer periods of time than are permitted by the leakage currents. One of the objects of the invention is to provide a memory element in which information in the form of electrical charge can be read-out non-destructively once or several times, and which can be refreshed at least once or if desired periodically in a simple manner by means present in the element itself. Another object of the invention is to provide a random access memory in which the information in the form of discrete packets of electrical charge can be stored in individual memory elements, can be read-out non-destructively, and can be refreshed once or several times by means which are present mainly at least in the elements themselves and hence not in the peripheral electronics.

The invention is based inter alia on the recognition of the fact that when memory elements are used of the type to which the present invention relates, output signals can be obtained already at cell level, which signals have a sufficiently large amplitude to control a switch, dependent on the stored information, via which electrical charge can be supplied or dissipated in the memory element for writing information, and that such a switch, constructed in the form of an insulated gate field effect transistor, can be integrated in any memory element in a very compact manner.

Accordingly, a semiconductor device of the kind described in the preamble is characterized according to the invention in that the semiconductor memory element comprises an insulated gate field effect transistor, hereinafter referred to as second field effect transistor, which is of the complementary type with respect to the first field effect transistor and which comprises two main electrode regions of which one is formed by the part of the semiconductor body which forms the storage region, and the other main electrode region is formed by a second surface region situated near the storage region, the second field effect transistor comprising at least a gate electrode which is insulated from the surface of the semiconductor body and which is coupled electrically to one of the main electrode regions of the first field effect transistor.

As will become apparent from the accompanying description of the Figures in which the operation of the device will be described in greater detail, the stored information can be refreshed by first resetting the depletion region or the charge storage region, that is bringing it in such a state that at least in the absence of signal charge carriers a comparatively large depletion region is formed. Dependent on the read-out information which is represented by the potential of the insulated gate electrode of the second field effect transistor and which determines whether the second field effect transistor is or is not conductive, charge carriers or no charge carriers can then flow in the charge storage region via the second field effect transistor. This operation can be carried out in an arbitrary number of times and at any instant suitable for that purpose, so that very long memory times are possible. Because leakage currents in a device according to the invention need no longer form a restricted factor as regards the length of the memory time, surface zones may be used instead of buried zones for the storage regions so as to obtain long memory times. This can mean a considerable simplification for the manufacture of the device.

In principle the refreshing operation may be carried out after each read cycle. In connection with, for example, the speed it is often desired for the refreshing operation to be repeated each time only after a certain number of reading-out operations.

A preferred embodiment of a semiconductor device according to the invention which inter alia presents the advantage of being particularly suitable, due to its compact structure, of being integrated monolithically in large numbers in large memories, is characterized in that the main electrode regions of the first field effect transistor are both formed by surface-adjoining zones of one conductivity type, and the second surface region which forms the said other main electrode region of the second insulated gate field effect transistor, is situated, viewed on the surface, between the said two main electrode regions of the first field effect transistor.

The second main electrode region of the second field effect transistor may be formed, for example, by a depletion region which is induced in the surface region of one conductivity type and which can be filled at least partly with minority charge carriers, that is charge carriers which are characteristic of the opposite conductivity type. The said second main electrode region is preferably formed by a surface zone of the second conductivity type so as to obtain low series resistances in the current track of the second field effect transistor. Said zone can advantageously be provided within the channel region of the first field effect transistor and form therewith a second gate region of the first field effect transistor. By means of said second gate region the first field effect transistor can be closed at will, also in those cases in which the information-representing charge in the depletion region which forms the charge storage region has such a value that the transistor is not closed or blocked by said depletion region. In the case of a memory having a large number of memory elements, said second main electrode region of the second field effect transistor of each cell can advantageously be used for the selection upon reading-out.

An important further preferred embodiment of a semiconductor device according to the invention is characterized in that the part of the semiconductor body which forms the said charge storage region is provided at the surface with a capacitive connection in the form of a conductive region which is separated from the said part of the semiconductor body by a blocking layer. By means of said capacitive connection, important operations can be carried out, for example, erasing, resetting, or selecting. For the capacitive connection may simply be used a conductive layer of, for example, metal or doped deposited polycrystalline silicon which is provided above the storage region and is separated herefrom by an intermediate insulating layer.

The first field effect transistor may be formed by a junction field effect transistor having an electrically floating gate region which forms the said charge storage region and which is separated from the channel region by a rectifying junction. The gate region may be formed by a surface zone of the second conductivity type which is provided in the surface region of one conductivity type and which forms a p-n junction with the channel region. Advantageously, a zone of the first conductivity type may be provided in the gate region so as to obtain a capacitive connection. However, the gate region is preferably covered with an insulating layer on which a conductive layer is deposited which is coupled capacitively to the gate region with the insulating layer as a dielectric.

In another embodiment the first field effect transistor is formed by a field effect transistor of the depletion type having a gate region in the form of a conductive layer which is insulated from the channel region with the insulating layer as a dielectric.

In another embodiment the first field effect transistor is formed by a field effect transistor of the depletion type having a gate region in the form of a conductive layer which is insulated from the channel region by an intermediate insulating layer. By means of said insulated gate region, a depletion region may be induced in the underlying channel region and extends from the surface into the channel region and forms the said charge storage region in which information can be stored in the form of minority charge carriers. In this embodiment in which the information is not stored in the gate region itself but in a part of the semiconductor body insulated electrically herefrom, the gate region may be provided directly with an ohmic connection.

The invention is of particular importance for random access memories having a semiconductor body which is provided at a surface with a conductor system of word lines and bit lines which, at the area of the crossings, are coupled electrically to memory elements provided in an underlying surface region of the semiconductor body of mainly one conductivity type which each comprises a field effect transistor, hereinafter referred to as first field effect transistor, having two main electrode regions of one conductivity type and an intermediate channel region of one conductivity type and having a gate region which is situated near the surface and by means of which a depletion region extending in the channel region can be formed in the semiconductor body which forms a charge region in which information in the form of electrical charge can be stored, which information can be read-out non-destructively, the bit lines being coupled to a first main electrode region of the field effect transistors and the word lines being coupled to a gate region of the first field effect transistors. According to the invention, such a device is characterized in that each semiconductor memory element comprises a second insulated gate field effect transistor which is of the complementary conductivity type with respect to the first field effect transistor, and which comprises two main electrode regions, one of which is formed by the part of the semiconductor body which during operation forms the said charge storage region and the other main electrode region of which is formed by an adjacent second surface region, the second field effect transistors each comprising an insulated gate electrode which is connected to an associated bit line. A preferred embodiment which shows a particularly compact structure is characterized in that the second surface region which forms the said other main electrode region of the second field effect transistor in each memory element, is formed by a surface zone of the second conductivity type which, viewed on the surface, is situated between the main electrode regions of the first field effect transistor.

A preferred embodiment which presents the advantage of a particularly compact configuration is characterized in that the second surface region which forms the said other main electrode region of the second field effect transistor in each memory element is formed by a surface zone of the second conductivity type which, viewed on the surface, is situated between the main electrode regions of the first field effect transistor. A further preferred embodiment is characterized in that the memory elements, on the sides parallel to the main direction of current of the first field effect transistors, are bounded by dielectric regions which extend from the surface over at least a part of the thickness of the semiconductor region of one conductivity type into the semiconductor body. The dielectric region is formed, for example, by silicon oxide which, when using a silicon semiconductor body, can simply be obtained by locally oxidizing the semiconductor body. By using such a dielectric insulation, field effect structures can be manufactured which are particularly suitable of being integrated monolithically in very large numbers in large memories, as will become apparent from the accompanying description of the Figures.

A preferred embodiment is characterized in that the word lines comprise a number of conductive paths each forming a capacitive connection of the parts of the semiconductor body which during operation form the charge storage regions of the memory elements which are coupled electrically in common to the same word line. A further preferred embodiment is characterized in that the device comprises a second system of word lines which are each time connected to the said other main electrode regions of the second field effect transistors of memory cells associated with the same word, each of the said other main electrode regions being formed by a surface zone of the second conductivity type which is situated within the channel region of the associated first field effect transistor. In this embodiment, each first field effect transistor forms a tetrode structure with two gate regions one of which may be used as an information storage region and the other of which, which also forms a second main electrode region of the second field effect transistor, may be used for the selection. In connection with the available space, the cells are oriented so that the word lines extend transversely to the longest axis of the elements. A further preferred embodiment is therfore characterized in that the dielectric regions are formed by stripes which, viewed on the surface, extend mainly parallel to the bit lines and in the surface region of one conductivity type define stripe-like islands which each comprise the memory elements associated with a bit line which are oriented so that the main direction of current of each of the said first field effect transistors is mainly parallel to the direction in which the bit lines extend. A further embodiment is characterized in that the device comprises a second system of word lines which are each connected to the said other main electrode regions of the second field effect transistors of memory elements associated with the same word, each of the said other main electrode regions being formed by a surface zone of the second conductivity type which is situated within the channel region of the associated first field effect transistor.

A semiconductor device as described above may be provided with circuit means for erasing, writing and reading the or each memory element in which by the erasion the gate region of the first field effect transistor of the or each memory element is brought at a potential at which in the semiconductor body a depletion region is formed which extends into the channel region of the first field effect transistor and forms a charge storage region for storing information-representing electrical charge, in which upon writing input signals are applied to the insulated gate electrode of the second field effect transistor which is coupled electrically to one of the main electrode regions of the first field effect transistor by which, via the second field effect transistor, a quantity of electrical charge determined by the input signal can be introduced into the said charge storage region which is decisive of the size of the formed depletion region in the channel region of the first field effect transistor, in which upon reading such voltages are applied at least periodically to the main electrode regions of the first field effect transistor that in the given charge state of the charge storage region the said insulated gate electrode potential can assume values which correspond to the said input signals as a result of which the charge state of the charge storage region can be refreshed periodically be periodically repeating the erasing/writing cycle.

A preferred embodiment is characterized in that the depletion region which forms the said charge storage region has such an extent, at least in the absence of charge supply via the second field effect transistor, that the underlying channel region of the first field effect transistor is pinched-off entirely so that the transistor is blocked. A further preferred embodiment is characterized in that means are present to block the first field effect transistor after writing the information in the charge storage region and to deblock it when said information should be read out. A preferred embodiment which in addition has the advantage that the number of voltage levels of the clock pulses to be applied during operation remains restricted is characterized in that the surface zone of the second conductivity type which forms the said second main electrode region of the second field effect transistor and is situated within the channel region of the first field effect transistor of the or each memory element is associated with the said means by which the first field effect transistor can be blocked independently of the written information and is connected to a voltage source with which the p-n junction between said surface zone and the channel region of the first field effect transistor can be reversely biased.

The invention will now be described in greater detail with reference to a few embodiments and the accompanying diagrammatic drawings, in which FIG. 1 is a plan view of a part of a device according to the invention, and of which FIG. 2 is a sectional view taken on the line II—II of FIG. 1, and FIG. 3 is a sectional view taken on the line III—III of FIG. 1, and FIG. 4 is a sectional view taken on the line IV—IV of FIG. 1.

FIG. 5 shows the clock-pulse diagram as a function of the time t of clock voltages which are applied during operation to the word lines of the device shown in FIG. 1.

FIG. 6 shows the potential as a function of the time t of the floating gate region of the device shown in FIG. 1 during operation.

FIG. 7 shows the potential of the bit lines as a function of the time t of the device shown in FIG. 1 during operation;

FIG. 8 shows an electrical circuit of a cell of the device shown in FIG. 1;

FIG. 9 is a plan view of a part of a second embodiment of a device according to the invention, of which

Figure 1:
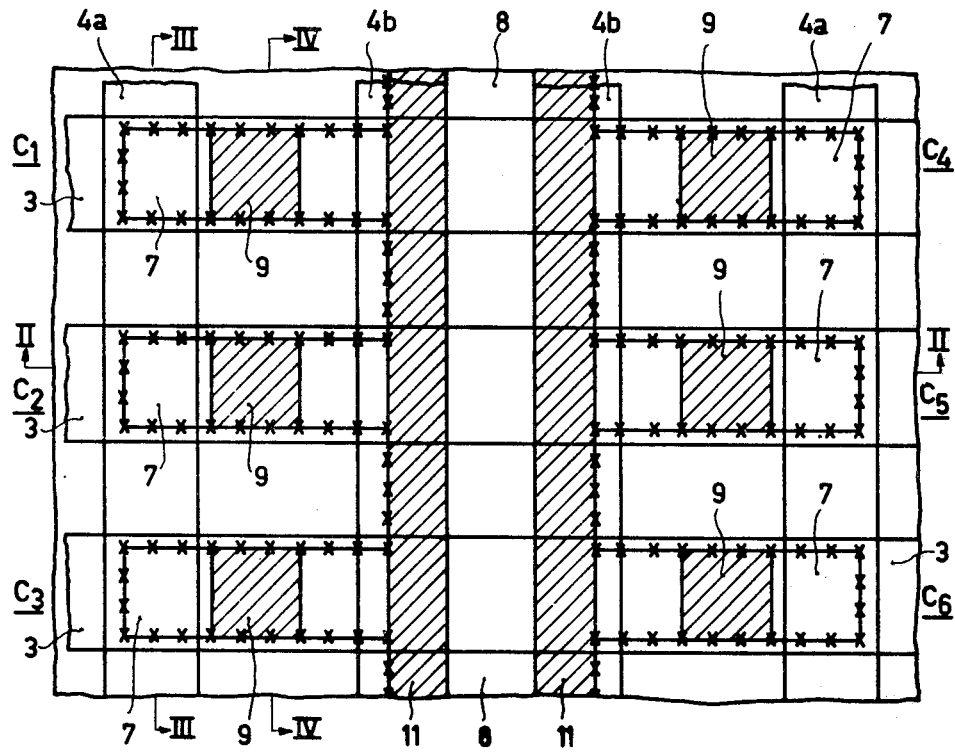

It is to be noted that the Figures are diagrammatic and are not drawn to scale. In addition, in the plan views shown in FIGS. 1 and 9, only zones and regions in the semiconductor body and conductor tracks provided on the semiconductor body are shown. Dielectric layers covering the surface of the semiconductor body are not shown to avoid complexity of the Figures.

FIGS. 1 to 4 show by way of example a plan view and a number of cross-sectional views, respectively, of a part of a semiconductor random access memory comprising a large number of memory elements which are accommodated in a common semiconductor body 1 and form a monolithic integrated circuit. Silicon is preferably chosen for the semiconductor body 1 because the technology of manufacturing integrated silicon circuits has made the best progress. The body 1 comprises a comparatively thin semiconductor layer 6 of one conductivity type, for example n-type silicon, adjoining the surface 2. The layer 6 is bounded on its lower side by a blocking junction 15 between the layer 6 and a supporting member 16 which preferably consists of p-type silicon but which may also consist of any other semiconductor material or of insulating material, for example, aluminium oxide.

Figure 2:
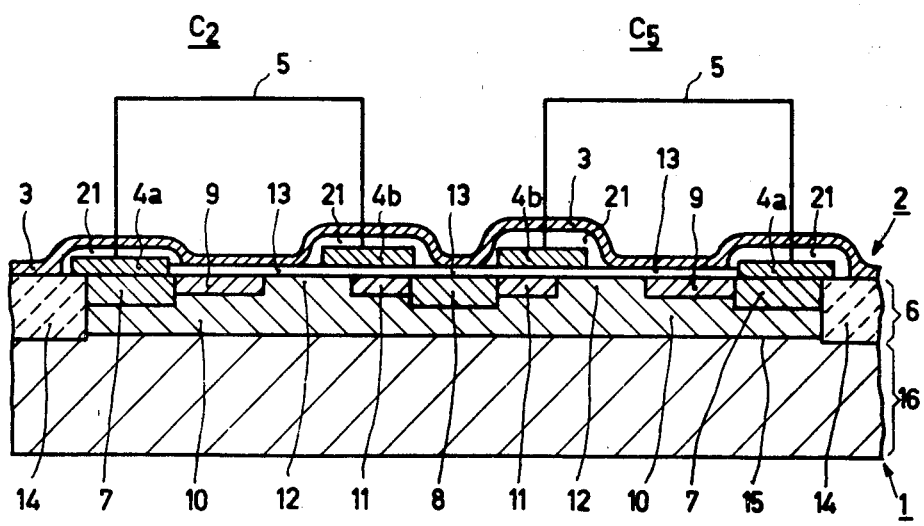

At its surface 2 the silicon body 1 is provided with word lines formed by the conductor tracks 3 extending from the left to the right in the drawings of FIGS. 1 and 2, and with bit/sense lines 4 extending in a direction transverse to the word lines 3. The bit lines 4 each comprise two conductor tracks which for distinction are each time given the reference numerals 4a and 4b. The conductor tracks 4a and 4b may be interconnected outside the part of the memory device shown in the Figures. This is shown diagrammatically by the connection 5 in FIG. 2. In a specific embodiment the word lines 3 are formed by aluminium stripes, while the bit lines 4 consist of semiconductor material, for example at least partly polycrystalline silicon which is doped with an impurity to obtain a sufficiently low resistivity. The word lines and bit lines are insulated from each other by an intermediate dielectric layer 21, in the present embodiment silicon oxide.

At the area of the crossings the word lines and bit lines 3, 4 are coupled to memory elements provided (at least mainly) in the underlying surface region 6 of mainly one conductivity type. In the example to be described the n-conductivity type is chosen for the said one conductivity type, but it will be obvious that the surface region 6 may alternatively consist of p-type semiconductor material, in which the conductivity types of the further zones and regions present in the body 1, as well as the polarity of the voltages to be applied during operation, should also be reversed.

The part of the memory device shown in FIG. 1 comprises six elements denoted successively by $C_1-C_6$ and arranged in a system of rows and columns which can be obtained by further expanding the part shown in FIG. 1 on its four sides by mirroring. Each of the elements or cells $C_1-C_6$ comprises a first field effect transistor having two n-type main electrode regions 7, 8 which can form the source and drain regions. As shown in FIGS. 1 and 2 the region 8 forms a common source or drain region of said field effect transistors which furthermore each comprise a gate region in the form of a surface-adjoining zone 9. In FIG. 1 the p-type regions are shaded for clarity.

The field effect transistors 7, 8, 9 in this example are thus formed by junction field effect transistors the gate electrode of which is separated from the channel region 10 between the main electrode regions 7, 8 by a rectifying junction. The operation of junction field effect transistors in memories is described inter alia in the publication already mentioned above and is in principle based on the following: by means of the—electrically floating—p-type gate region 9, a depletion region can be formed in the body 1 and extends partly in the gate region 9 and partly in the channel region 10 and controls the conductibility or conductance in the channel region 10. Said depletion region can be obtained by storing negative charge in the gate region in some way or another. Since the gate region does not have an electric connection via which said negative charge can be neutralized, the depletion region can be maintained for a certain period of time which is determined mainly only by leakage currents. By subsequently providing positive charge in the depletion region, the size of the depletion region and hence the resistance in the channel region can be varied. Writing binary signals may now be carried out as follows. The memory sites are first erased by applying such a negative potential to the gate regions 9 that a depletion region is formed in the channels 10 so that at least in a given circumstance the transistors 7, 8, 9 are non-conductive. The charge state of the gate regions may in this situation be assumed to be equal to, for example a logic "0." The logic "1" may then be written by forming in the desired memory sites a certain amount of positive charge in the depletion regions formed at that area as a result of which in the said circumstance the associated transistors 7, 8, 9 will be conductive. The information written in the memory may be read non-destructively simply by determining the conductance (or resistance) of the channel 10 between the main electrode regions 7, 8. The output signals may be derived from the bit lines 4. Since the information can be read non-destructively, a very large charge amplification can be obtained. In addition, the information can often be read out more than once without each time having to be written again.

In the semiconductor device in the present embodiment the stored information which in known devices may disappear in the course of time as a result of leakage currents can be refreshed at cell level without the use of external amplifiers, that is amplifiers arranged outside the cell, for example, in the peripheral electronics, and hence while maintaining a very compact structure. For that purpose, each element $C_1-C_6$ has a second insulated gate field effect transistor of the complementary type with respect to the transistors 7, 8, 9 so in the embodiments having a p-type channel. Said second transistor comprises two main electrode regions one of which is formed by the part of the semiconductor body 1 which during operation forms the said charge storage region. In the present case in which the first field effect transistors consist of junction field effect transistors, the said one main electrode region of the second transistors may be identified with the p-type gate region 9 of the transistors 7, 8, 9. The other main electrode region is formed by an adjacent second surface region 11. Said region which during operation should be capable inter alia of supplying holes to the zone 9 may be formed, if desired, by a p-type inversion layer induced in the n-type region 6 and adjoining the surface 2. In this case said region consists of a p-type doped surface zone 11. In FIG. 1 two of said zones 11 are shaded, the left-hand one of which is common to the elements of the columns $C_1$, $C_2$ and $C_3$ and the right-hand one of which is common to the elements of columns $C_4$, $C_5$, $C_6$.

The said second field effect transistors comprise at least an insulated gate electrode which is coupled to the bit lines and hence to the main electrode regions 7 associated with the corresponding memory elements $C_1-C_6$, as a result of which the second transistors can be opened or closed in accordance with the charge stored in the regions 9. Said gate electrodes are formed by the conductor tracks 4b which are separated from the underlying channel region 12 of the second field effect transistors by the thin oxide layer 13 and are conductively connected, via the conductor tracks 4a, to the main electrode regions 7 of the junction field effect transistors 7, 8, 9. The two conductor tracks 4b which are shown in FIG. 1 constitute a common insulated gate electrode for the column of memory elements associated with $C_1$, $C_2$ and $C_3$ and a common gate electrode for the second field effect transistors associated with the column $C_4$, $C_5$ and $C_6$, respectively.

As shown in FIGS. 1 and 2, the gate electrodes 4b are situated above only a part of the channel regions 12 of the second field effect transistors, namely only above a part which adjoins the p-type zones 11. The conductivity through the remaining part of the channel region 12 which adjoins the p-type zones 9 can be controlled by means of the word line 3 which is also separated from the channel region 12 by the comparatively thin insulating layer 13. The function of the word lines 3, as an insulated gate electrode of the said second field effect transistors, will become apparent hereinafter in the description of the operation of the device. The second field effect transistors with main electrode regions 9, 11 and insulated gate electrodes 4b, 3 will hereinafter be referred to as the transistors (9, 11, 4b, 3).

The main electrode regions 7 and 8 of the junction field effect transistors 7, 8, 9 adjoin the surface 2 of the semiconductor body 1. The p-type surface zones 11 which form the second main electrode region of the field effect transistors (9, 11, 4b, 3) are situated between the main electrode regions 7 and 8 of the junction field effect transistors (7, 8, 9) when viewed on the surface 2. The transistors (9, 11, 4b, 3) are therefore integrated substantially entirely in the associated junction field effect transistors (7, 8, 9) and as a result of this require comparatively little extra space within the semiconductor body 1.

On the sides parallel to the main direction of current between the main electrode regions 7 and 8 of the junction field effect transistors 7, 8, 9 the memory elements $C_1$-$C_6$ are bounded within the semiconductor body by dielectric regions 14 extending from the surface 2 throughout the thickness of the surface region 6 in the semiconductor body 1. The use of the dielectric 14 considerably simplifies the composition of large numbers of junction field effect transistors in a common compact integrated circuit. In conventional integrated circuits the gate regions of such junction field effect transistors usually show a closed, for example, an annular structure surrounding one of the main electrode regions of the transistor. As a result of the dielectric boundary of the junction field effect transistors the gate regions 9 can be constructed simply as rectangular zones as shown in FIG. 1 on either side of which the main electrode regions 7 and 8 are situated. The gate regions 9 may in addition directly adjoin the region 14.

The region 14 is formed by silicon oxide which is obtained by locally oxidizing the semiconductor body. In the embodiment the silicon oxide region 14 extends throughout the thickness of the layer 6. In another embodiment, however, the silicon oxide region 14 may also extend only over a part of the thickness of the n-type layer 6 and be replaced for the remaining part of the thickness of the n-type semiconductor layer 6 by an adjoining p-type region. It should, of course, be avoided that such p-type regions can form a short-circuit with the p-type gate regions 9.

In the plan view of FIG. 1 the boundary of the oxide 14 sunk in the semiconductor body 1 is denoted by a chain line.

As is furthermore shown in FIG. 1, the elements $C_1$-$C_3$ associated with the column are shown on the left-hand half of the Figure mirror-symmetrically with respect to the elements $C_4$-$C_6$ associated with the column shown on the right-hand half of the Figure. As a result of said mirror-symmetry the n-type zone 8 may form a common main electrode region for both columns so that an extra reduction of the size of the structure can be obtained.

For illustration of the operation of the device, FIG. 8 is a sectional view of a cell shown in FIG. 2 with the voltage sources which are connected to various parts of the cell during operation. It is to be noted that values for, for example, threshold voltages and pinch-off voltages of the transistors depend upon parameters, inter alia thickness of insulating layers and channel regions and doping concentrations of various semiconductor regions. The values hereinafter for threshold voltages and pinch-off voltages which consequently apply actually only to a specific embodiment of the device, are used only to illustrate the operation of the device. When values of voltages are stated, the potential of the substrate 16 is used as a reference voltage. Therefore, the substrate 16 is connected to earth for simplicity in the circuit shown in FIG. 8.

The n-type main electrode region 8 of the JFET 7, 8, 9 and the p-type main electrode region 11 of the IGFET 9, 11, 4b, 3 are set up at a fixed voltage of, for example, 10 Volts by means of the voltage source 17. The device may be manufactured so that at the said voltage of 10 Volts the pinch-off voltage of the JFET 7, 8, 9 (that is the voltage at which the channel is pinched-off entirely and the transistor can no longer pass current) is approximately 6.5 Volts, while the threshold voltage of the IGFET (9, 11, 4b, 3) is approximately 1 Volt. The IGFET is therefore of the depletion type, that is to say that the transistor is conductive in the absence of a voltage difference between the insulating gate electrodes 3, 4b on the one hand and the n-type region 6 and the p-type region 11 short-circuited therewith on the other hand. The word line 3 is connected to a clock generator 18. The voltage pulses which are supplied by the generator 18 are shown as a function of the time t in FIG. 5. The bit line 4a, 4b is connected to a voltage source 19 and to a detector device 20 in behalf of reading-out. The potential of the bit line 4a, 4b is shown in FIG. 7 as a function of the time t. The potential of the information-containing p-type gate region 9 is shown as a function of the time t in FIG. 6. The figures 5–7 have a common time axis provided with the various instants t1–t8. The various operations may now be carried out as follows.

Writing: by means of the source 19, 10 V or 13 V, corresponding to a logic "0" or a logic "1," respectively, is applied to the bit line 4 between t0 and t3. Of course, 10 V could also correspond to a "1" and 13 V to a "0"-signal. In FIG. 7 the potential of the bit line 4 is denoted by a chain line for the case in which 13 V is applied and by a solid line for the case in which 10 V is applied to the bit line during writing. The voltage source 18 simultaneously supplies to the word line 3 the voltage levels:

t0: 18 V
t1: 10 V
t2: 15 V
t3: 11 V

The cycle which is followed simultaneously by the p-type gate region 9 is approximately as follows.

t0: Because the gate region 9 is capacitively coupled strongly to the word line 3 the potential of the gate region 9 will in principle follow the potential jumps of the word line 3. However, the potential of the gate region 9 cannot become higher than 10 V because otherwise the p-n junction between the p-type gate region 9 and the n-type region 10 would be biased in the forward direction and would pass current until the potential of the gate region 9 has dropped again to substantially 10 V.

It is to be noted that the floating gate region 9 is coupled capacitively not only to the word line 3 but also to the underlying n-type channel region 10. As a result of the associated voltage division the zone 9 will not make exactly the same potential jumps as the word line 3. For simplicity this has not been taken into account in the present description. Actually the potential jumps of the zone 9 may hence be slightly smaller than according to the numerical example described here.

t1: The word line 3 drops to 10 V. In the case in which 13 V is applied to the bit line 4, the IGFET is closed and the gate region 9 can in principle make the same potential jump again as the word line. In FIG. 6 said potential jump is denoted by chain lines. The potential of the gate region comes at approximately 2 V. When, however, a voltage of 10 V is applied to the bit line 4, the IGFET (9, 11, 4b, 3) is opened, for the gate voltage at which said transistor becomes conductive is 11 Volts. Via the IGFET holes can flow from the p- type region 11 (source) to the gate region 9 (drain). The potential of the gate region 9 (shown in FIG. 6 by a solid line) remains approximately equal to the voltage of the region 11, hence approximately 10 V.

t2: The source 18 supplies a voltage pulse to the word line of 15 Volts so that in both cases the IGFET (9, 11, 4b, 3) is closed again. In the case in which the potential of the floating gate region was already 10 Volts, the potential of the gate region can no longer increase further because otherwise the p-n junction with the region 6 is opened again, therefore, in this case the potential of the gate region remains at approximately 10 V. In the other case, however, in which the voltage of the floating gate region was approximately only 2 V, the gate region 9 can in principle follow indeed the potential jump on the word line 3. The voltage at the gate region increases to approximately 7 V.

t3: The voltage at the word line decreases to approximately 11 V. In both cases said potential jump is followed by the floating gate region 9, that is to say in the case in which a "0" is written the gate region 9 comes at approximately 6 Volts; when a "one" is written the gate region 9 comes at a potential of approximately 3 Volts, that is approximately 3 Volts lower than in the other situation. In both states the JFET 7, 8, 9 which is closed at a voltage of 6.5 Volts, is closed. When a voltage differing from 10 V is applied to the bit line 4, for example, a voltage of 13 V, in behalf of reading-out another cell associated with the same column as the cell shown in FIG. 8, no current can flow through the JFET 7, 8, 9.

READING t4: The word line 3 associated with a cell to be selected is brought at approximately 14.5 V by means of the voltage source 18, while the associated bit line 4a and 4b is charged electrically to 13 Volts. As a result of the voltage pulse at the word line 3 the potential of the underlying gate region 9 also increases by approximately 3 Volts. In the case in which the stored information represents a "0," the potential of the gate region 9 increases from 6 Volts to approximately 9.5 Volts. In this situation the JFET 7, 8, 9 is open and the potential of the bit line 4 can decrease to 10 Volts. This voltage variation can be detected by means of the detector device 20 shown diagrammatically. In the case in which the stored information represents a "1," the potential of the gate region 9 will increase from 2 Volts to approximately 6.5 Volts as a result of the voltage pulse at the word line 3. In this situation the JFET 7, 8, 9 is still just pinched-off so that the voltage at the bit line 4 will not decrease but will remain approximately 13 Volts.

Simultaneously with the cell shown in FIG. 8, the cells situated in the associated row (word) can be read-out. The voltage difference which can be detected by the detector 20 between "0" and "1" is therefore approximately 3 Volts. This difference is very large so that no particular requirements need be imposed upon the sensitivity of the detector 20. Moreover, reading-out takes place non-destructively, that is that the information stored in the gate region is not lost as a result of the reading-out. Reading-out may therefore last so long until interference signals which may occur in the output signal as a result of voltage pulses to be applied are attenuated entirely or at least substantially entirely. In addition, the information may be read-out several times in succession. For that purpose the JFET 7, 8, 9 after reading-out can be closed again simply by applying again a voltage of 11 Volts to the word line 3.

Refreshing

The information stored in the gate region 9 may be lost in the course of time as a result of leakage currents. For a long-lasting storage of the information the refreshing operation is therefore necessary. The frequency with which said operation is carried out is determined by the value of the leakage currents. With the present prior art, time intervals of a few tens of m.sec. between successive refreshing operations seem achievable. In the operating diagram of FIGS. 5–7 such a refreshing operation is carried out immediately after reading-out the cell during the interval t5–t8 in behalf of the description of the operation of the device. The fact is used that just as upon writing the information, upon reading-out two potential values may occur at the bit line 4 one of which is larger and the other of which is smaller than the threshold voltage of the IGFET (9, 11, 4b, 3). The original charge state of the charge storage region 9 may therefore be restored simply by applying, during the interval t5–t8, the same clock pulses to the word line 3 as during the writing interval t0–t3. Simultaneously with the cell shown in FIG. 8, the other cells associated with the same word may of course also be subjected to the refreshing operation.

The semiconductor device described with reference to this embodiment can be manufactured by means of the conventional technologies available for the manufacture of integrated circuits. Starting material is the p-type silicon substrate 16 the thickness of which is approximately 250 $\mu$m and the doping concentration is approximately $2.7.10^{15}$ acceptor atoms per cm$^3$. The surface region 6 is provided in the form of an n-type epitaxial layer deposited on the substrate 16 in a thickness of approximately 2 $\mu$m and a doping concentration of approximately $5.10^{15}$ donors per cm$^3$. Instead of by epitaxy the n-type region 6 may alternatively be obtained by overdoping a part of the p-type substrate 16 by implantation of ionized donors.

An oxidation mask may then be provided in the form of a pattern of, for example, silicon nitride, after which the semiconductor body is subjected to an oxidation treatment so as to obtain the oxide pattern 14 sunk in the body at the area where the body 1 is not masked by the nitride pattern. The manners in which an oxide pattern 14 can be obtained which is sunk in the body 1 substantially over its entire thickness are generally known so that they need not be further described. The sunken oxide pattern 14 in another embodiment may also project slightly above the surface 2 of the body 1.

In a subsequent step the surface 2 is provided with a doping mask in behalf of the p-type gate regions 9 and the p-type zones 11. Said p-type zones 11 may be provided, for example, by means of diffusion or implantation of boron atoms having a comparatively low surface concentration of approximately $2.10^{17}$ atoms/cm$^3$ and a depth of approximately 0.5 $\mu$m. The mask may then be removed after which the silicon oxide layer 13 is formed, for example, by means of thermal oxidation. A specific value for the thickness of the layer 13 is 0.1 $\mu$m. The layer 13 is removed again by etching in places where the stripes 4a will be formed in a subsequent process step.

An approximately 0.5 $\mu$m thick silicon layer is then deposited on the body. This layer will usually show a polycrystalline structure insofar as it is provided on silicon oxide layers. Where the silicon oxide layer 13 was removed, at the area where the stripes 4a are to be formed, the silicon layer deposited on the material of the body 1 may show a monocrystalline structure.

The bit lines 4 may be formed from the said deposited silicon layer by means of a masked etching treatment. In a subsequent step the n-type main electrode regions 7, 8 may be provided, for example, by diffusion of phosphorus atoms. Simultaneously the monocrystalline or polycrystalline stripes 4a, b are also doped. The doping concentration is not critical and is chosen to be as high as possible so as to obtain series resistances which are as low as possible. The n-type zones 7 and 8 may directly adjoin the p-type zones 9 and 10, respectively because the breakdown voltage of the p-n junction between the zones 7, 9 and between the zones 8, 11 is comparatively high as a result of the comparatively low doping concentration of the p-zones.

The bit lines 4 are then oxidized partly so as to obtain the silicon oxide layer 21 which insulates the word lines and bit lines at the area of the crossings. The thickness of the oxide layer 21 is, for example, approximately 0.3 $\mu$m.

In a subsequent stage contact windows can be etched in known manner in the oxide layers present, after which an aluminium layer can be deposited from which the word lines 3 can be formed inter alia by etching.

In order to obtain the correct threshold voltage for the IGFET (9, 11, 4b, 3), a light p-implantation may be carried out (for example approximately $2.10^{11}$ atoms/cm$^2$) in the channel region 12 of the IGFET, if desired.

The dimensions of the memory cells may be small, because as a result of the non-destructive reading-out the information storage sites may be very small, this in contrast with, for example, 1-MOST-per-bit memories in which information stored in comparatively large capacitors is read-out destructively indeed. A length of a single cell, viewed in a direction parallel to the word lines 3 (including a part of the oxide pattern 14) of approximately 22.5 $\mu$m, and a centre distance between two successive cells in the same column of approximately 12 $\mu$m are achievable with the present-day technology. With these dimensions, approximately 270 $\mu^2$m of semiconductor surface area is hence necessary per element, which means that it is possible to integrate many thousands of these elements in a common semiconductor body.

In the example described clock pulses of four different voltage levels which are necessary for writing, erasing and selecting the memory elements are applied to the word lines 3 by the clock voltage source 18.

With reference to the following embodiment shown in FIGS. 9 to 13, a mode of operation will be described in which clock pulses having only two voltage levels can be applied to the word lines. Besides in the mode of operation, this embodiment also differs slightly from the first embodiment in structure so that important further advantages can be obtained as regards the form in which the memory elements are accommodated in an integrated circuit. For simplicity, the same reference numerals are used for corresponding components in FIGS. 9 to 13 as in the preceding embodiment.

As will be explained hereinafter, the mode of operation can be simplified by performing the selection not on the gate regions of the JFET's which form the charge storage regions, but on the second main electrode regions 11 of the IGFET's. Said regions 11 which are situated between the main electrode regions 7, 8 and in the channel region 10 of the JFET's may be used as second gate region of the JFET's. For this reason, the p-zones 11 during operation are not set up at a fixed potential, as in the preceding embodiment, but are connected, via a connection 25 shown diagrammatically in FIG. 10, to an overlying conductor 3b which forms a system of word lines with the zones 11. It is to be noted that the word lines 3 are divided into two sub-systems. One sub-system is formed by the stripes 3a which, just as in the preceding embodiment, are situated above the charge storage regions 9 and each form a capacitive connection for said floating regions 9. The other system is formed by the stripes 3b which, outside the part shown in the Figures, may be connected to the underlying p-type zones 11. The bit/read lines 4 each comprise only a single conductive stripe which is each time contacted to an n-type main electrode region 7 of the JFET structures associated with the same row and which also form the insulated gate electrode of the IGFET structures (9, 11, 4).

Figure 9:
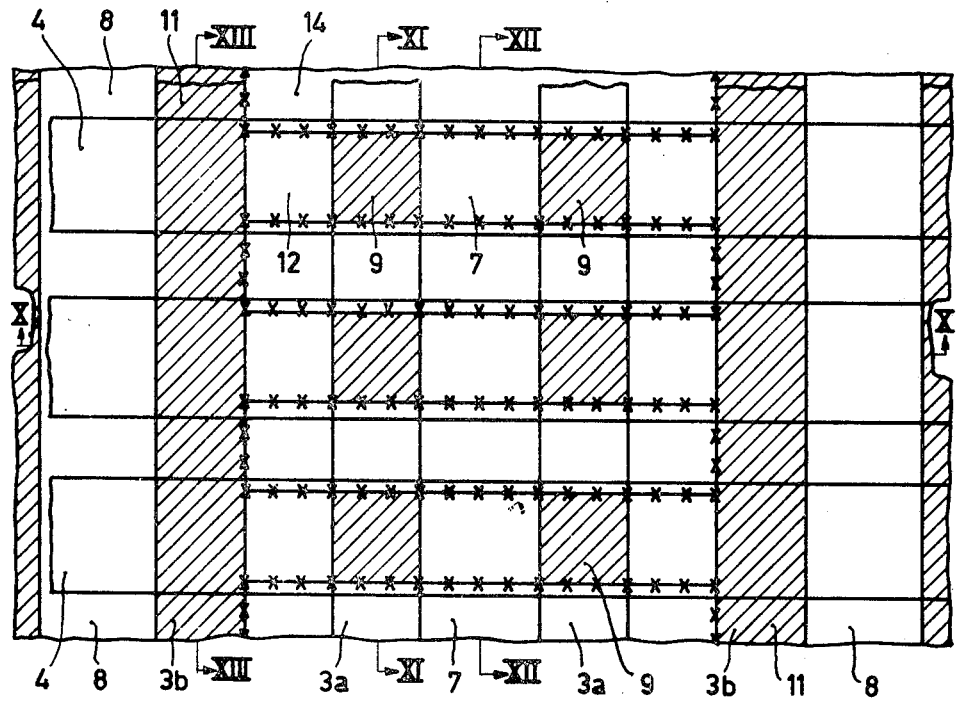

A further important difference from the preceding embodiment resides in the fact that the longitudinal direction of the JFET structures (7, 8, 9, 11), that is the direction parallel to the direction of current between the main electrode regions 7 and 8, extends parallel to the bit lines 4 and transversely to the word lines 3. So in this embodiment words are formed by columns of memory elements. The dielectric regions 14 of sunken silicon oxide which in FIG. 9 are denoted again by chain lines, constitute stripes which extend mainly parallel to the bit lines 4 and define in the semiconductor body 1 stripe-shaped islands comprising memory elements associated with the same bit line. As shown in FIG. 9, the stripes 14 do not extend continuously throughout the matrix but show interruptions via which the n-type regions 8, and the adjoining p-type zones 11, extend in the semiconductor body in a direction transverse to the bit lines 4 and form a common second main electrode region of the JFET structures, and a second main electrode region of the IGFET structures of memory elements associated with the same column, respectively.

The memory elements are provided so that elements situated in the same row and beside each other are again mirror-symmetrical with respect to each other. As a result of this the JFET structures (7, 8, 9, 11) of every pair of juxtaposed elements may show a common main electrode region. In the sectional view shown in FIG. 10 in which two elements C8 and C9 are shown entirely, and two elements C7 and C10 are shown partly only on the left-hand side and on the right-hand side, respectively, of the Figure, the n-type region 8 on the left-hand side forms a common main electrode region of the JFET structures of the elements C7 and C8; the n-type region 7 in the centre of the Figure is common to the elements C8 and C9; the n-type region 8 on the right-hand side of the Figure is common to the elements C9 and C10. Dielectric insulation by means of regions 14 of sunken oxide within a row of elements, as in the preceding embodiment, is not necessary in this case so that the structure can become extra compact.

Figure 14:
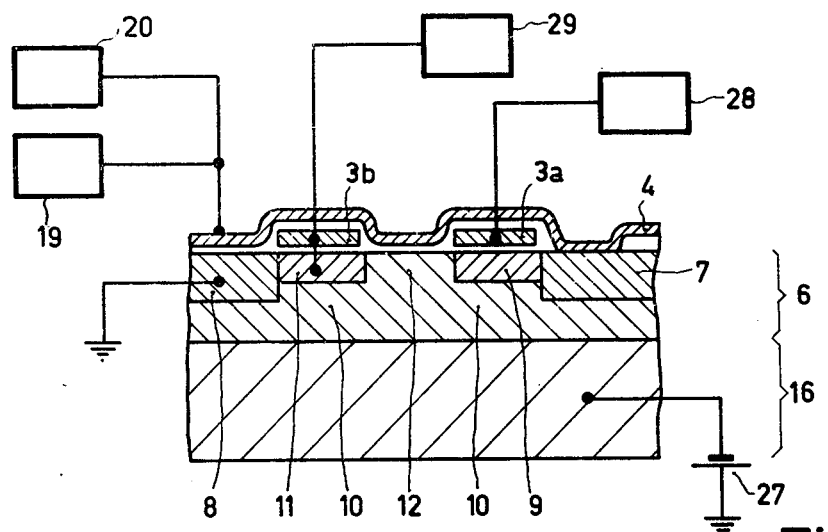
FIG. 14 shows a cell of the device shown in FIG. 9 in an electric circuit.

The operation of the device will be explained with reference to FIG. 14, which shows a single cell with associated voltage sources, and FIGS. 15 to 18 which show the clock pulses and voltages to be applied to the word lines and bit lines and the region 9 as a function of time.

The way in which the device is operated will again be described with reference to numbers which are given only to illustrate the operation of the device. It is assumed that the IGFET (9, 11, 4) has a threshold voltage of 1 V at a voltage to the source zone and the channel region 12 of 0 V. Therefore, in this example also the IGFET is of the depletion type. At a voltage of −10 V which is applied to the p-type substrate 16 by means of the voltage source 27, the pinch-off voltage of the JFET (7, 8, 9) is assumed to have a value of approximately −6 Volts.

Figure 17:
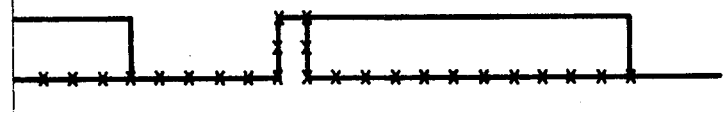
FIG. 17 shows the potential of the bit line 4 in FIG. 14 during operation as a function of the time t.

All the n-type main electrodes 8 of the JFET's are set up at a reference voltage, for example earth. The bit lines are connected again to a read-out member 20 for reading-out voltages and to a voltage source 19 by means of which during writing a voltage signal can be applied to the bit line 4 and in behalf of reading the bit line can be charged to a given voltage level. FIG. 17 shows the voltage at the bit line as a function of the time t. The voltage variation is denoted by a solid line for the case of a logic "0" and by a chain line for the case of a logic "1."

Figure 15:
FIG. 15 shows a clock pulse diagram as a function of the time t of clock voltages which are supplied during operation by the source 28 shown in FIG. 14.
Figure 16:
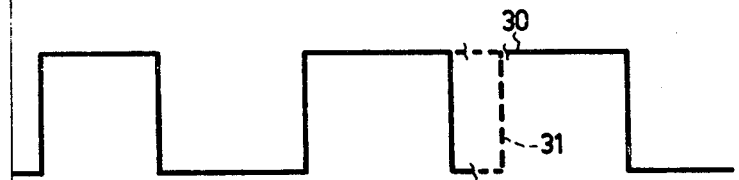
FIG. 16 shows the clock pulse diagram of clock voltages which are supplied during operation by the source 29.
Figure 18:
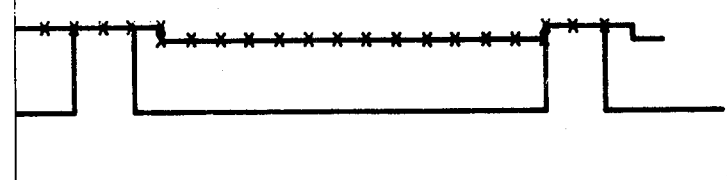
FIG. 18 shows the potential of the region 9 in FIG. 14 during operation as a function of the time t.

The word lines 3a which are situated above the charge storage regions 9 are connected to a clock voltage source 28 which clock pulses between −10 Volts and 0 Volts can be applied as is shown in FIG. 15. The word lines 3b and the p-type zones 11 connected thereto are connected to a clock voltage source 29 with which clock pulses also between −10 and 0 Volts can be applied as is shown in FIG. 16. FIG. 18 shows the potential variation of the p-type zone 9 as a function of the time t, namely by a solid line for a logic "0" and by a chain line for the case of a logic "1." It is to be noted that, for completeness' sake the voltage division across the capacitance formed between the zone 9 and the word line 3 and the capacitance between the zone 9 and the channel region in the following numerical example has indeed been taken into account in contrast with the preceding embodiment. As a result of this voltage division the potential jumps of the zone 9 may be slightly smaller than those of the word line 3a.

The write/erase cycle is as follows:

t0: A voltage of 0 V is applied to the (selected) word line 3b so that the channel 10 of the JFET below the p-type zone 11 is opened. A voltage of 5 Volts for writing a logic "0" or a voltage of 0 V for writing a logic "1" is applied to the (selected) bit line 4. In the first-mentioned situation the IGFET is closed because the potential of the bit line is higher than the threshold voltage; in the other situation in which the voltage at the bit line 4 is lower than the threshold voltage, the IGFET is open.

t1: The potential of the (selected) word line 3a increases from −10 to 0 V. The potential of the p-type zone 9 coupled capacitively to the word line 3a can follow not further than approximately 0 V.

t2: The potential of word line 3a again decreases to −10 V. In the case in which a voltage of 5 V was applied to the bit line 4 (IGFET is closed), the p-type zone can in principle follow the voltage drop at the word line 3a. The p-type zone 9 then comes at a potential value of, for example, approximately −6.9 V. At this potential the p-n junction between the p-type zone 9 and the n-type region 6 is reversely biased to such an extent that the underlying channel 10 is entirely pinched-off. The negative charge which in this state is stored in the floating region 9 cannot disappear via the cut-off p-n junction except as a result of leakage currents which determine the charge storage time within which the information can be maintained in the region 9 without refreshing operations.

When, however, a "1" is written by applying a voltage of "0" V to the bit lines, the IGFET (9, 11, 4) is opened. In principle the potential of the p-type zone 9 remains equal to the potential of the p-type zone 11 which forms a source zone for holes which can flow from the IGFET to the zone 9 serving as a drain zone, via the channel 12. The potential of the zone hence remains above the pinch-off voltage of the JFET so that in this case current conduction is possible indeed in the channel 10 below the zone 9.

t3: A voltage of approximately 10 V is applied to the word lines 3b and the p-type zones 11 by means of the voltage source 29. The channel 10 of the JFET structure below the zone 11 which now serves again as second gate region of the JFET is entirely pinched-off. Irrespective of the information stored in the region 9, the JFET is closed. In the case in which a logic "1" is written on the zone 9, a little charge may flow from the zone 9 via the IGFET (9, 11, 3b) until the voltage difference between the zone 9 and the bit line 4 is smaller than the threshold of the IGFET. This is shown in FIG. 18. The potential of the zone 9 in that case is approximately −1 V. Reading may be carried out as follows:

t5: For reading out the stored information, the bit line 4 is charged to approximately 5 Volts by means of the voltage source 19.

t6: By means of the voltage source 29 a voltage of 0 V is applied to the selected word line 3b. The channel 10 below the zone 11 is no longer blocked. In the case in which the stored charge corresponds to a "1," the channel 10 below the zone 9 is not blocked and the JFET is hence open. The potential of the bit line may then fall to 0 V. In the case in which the information stored in the region 9 represents a "0," however, the channel 10 below the zone 9 remains closed and hence also the JFET. In this situation the potential of the bit line 4 remains approximately 5 Volts.

The output signals on the bit line 4 can be detected by means of the device 20. Due to the non-destructive character of the reading-out, the duration of the reading-out may be continued so long as is desired in connection with, for example, interference signals as a result of voltage pulses to be applied.

t7: After reading-out, a voltage of −10 V can be applied again to the word line 3b and the zone 11 so as to close the JFET. The information may then be read again, if this is desired. However, in order to prevent the possible disappearance of information as a result of leakage currents, it is useful to refresh the information from time to time. The refreshing step which may take place immediately after a reading-out cycle, may be carried out after repeating the write cycle at the word lines 3a, 3b. The information is automatically written again because the potential of the bit line 4 upon reading-out will assume a value which, just as during writing the information, is larger or smaller than the threshold voltage of the IGFET (9, 11, 4), so that dependent upon the output signal, the IGFET will remain open or closed. The various voltage levels are preferably chosen to be so that the output signals which may appear at the bit line 4 have the same value as the input signals supplied via the bit line 4.

For refreshing the stored information, a voltage of 0 V is applied to the word line 3b and the zone 11 connected conductively therewith, which means that in the case in which the refreshing operation takes place immediately after a reading-out operation the voltage at the word line 3b and the zone 11 remains 0 V (indicated in FIG. 16 by the line 30). In other cases, denoted in FIG. 16 by the broken line 31, in which the refreshing operation is not carried out immediately after a reading-out operation but, for example, each time after a given time interval, the voltage at the word line 3b and the zone 11 is increased from −10 V to 0 V so as to open the JFET channel 10 below the zone 11. In the time interval t8–t9 the same voltage pulse 32 as during the writing operation is applied to the word line 3a above the storage region 9. As a result of this pulse the zone 9 is charged again unless the bit line 4 has such a voltage that the zone 9 can be discharged via the IGFET. At the instant t10 the potential at the word line 3b and the zone 11 is reduced to −10 V so as to pinch-off the channel 10 below the zone 11 and hence to close the junction field effect transistor (7, 8, 9, 11) irrespective of the stored information.

The invention provides not only a new device as regards structure and operation, but also provides a particular method of manufacturing the semiconductor device. The device can be manufactured by means of generally known standard techniques. However, a preferred method which has considerable advantages will be described hereinafter. Starting point is the stage in which the semiconductor 1 is provided with the pattern 14 of sunken silicon oxide and the n-type surface regions 6 in which the memory elements are provided. The n-type regions 6 can be obtained by epitaxy on the p-type substrate 16, (prior to providing the sunken oxide 14) or by means of ion implantation of an n-type impurity in the p-type substrate (prior to or after providing the sunken oxide 14).

Figure 19:
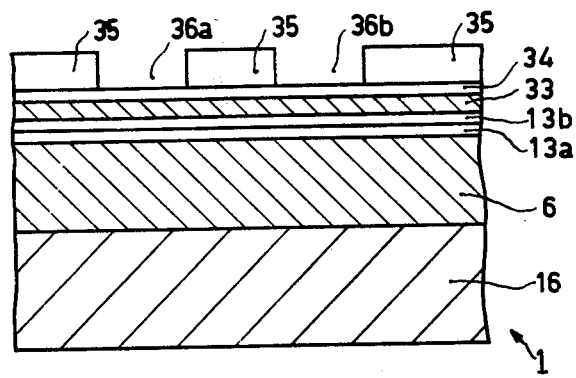
FIGS. 19 to 22 are sectional views corresponding to the sectional view shown in FIG. 10 of a cell of the device shown in FIG. 9 during a few stages of the manufacture thereof.

In this stage of the process, the dielectric layer 13 is provided on the surface 2 of the semiconductor body 1 after masking layers in behalf of the provision of the sunken oxide pattern 14 have been removed. Of course, instead of the dielectric layer 13, the said masking layers (in that case not removed) for providing the pattern 14 might also be used. In FIG. 19 which is a sectional view corresponding to that shown in FIG. 14 during the manufacture of the device, the dielectric layer 13 is shown as a double layer comprising a layer 13a of silicon oxide of, for example, 800 Å provided directly on the surface, and a layer 13b of silicon nitride of, for example, 400 Å thickness. If desired, the silicon nitride may be omitted but in a later stage it presents a few advantages when the polycrystalline stripes 3a, 3b are subjected to an oxidation treatment. A polycrystalline silicon layer 33 of approximately 0.5 μm thickness is deposited on the nitride 13b. A layer 34 of silicon nitride is then provided. The thickness of said layer is not critical.

A mask 35 of a suitable photolacquer is provided in known manner on the silicon nitride layer 34. The photo-mask shows stripe-shaped parallel windows 36a, b at the area where the polycrystalline word lines 3a, 3b with the underlying p-type zones 9 and 11, respectively, are to be provided in a later stage of the manufacture.

FIG. 19 shows a relevant part of the device in this stage of the manufacture.

The silicon nitride layer is then subjected to a masked etching treatment in, for example, a solution of phosphoric acid at a temperature of approximately 150° C. In this treatment the nitride is removed in sofar as it is not covered by the mask 35. In the next step, boron ions are implanted via the windows in the photolacquer layer 35 and through the polycrystalline silicon layer 33 and the underlying dielectric layers 13a and 13b in the semiconductor body 1 so as to obtain the p-type zones 9 and 11. The implantation, shown diagrammatically in FIG. 20 by the arrows 41, may be carried out with boron ions at an energy of, for example, approximately 150 KeV. Damages, if any, in the crystal lattice of the body 1 resulting from said treatment may be removed at least for the greater part by heating the body 1. The p-type zone 11 shows at least mainly the same shape as the overlying stripe-shaped window 36a. Below the stripe-shaped window 36b, however, a column of p-type regions 9 is obtained which are separated from each other by the already provided sunken oxide pattern 14 which, however, is not visible in FIG. 20.

Figure 20:
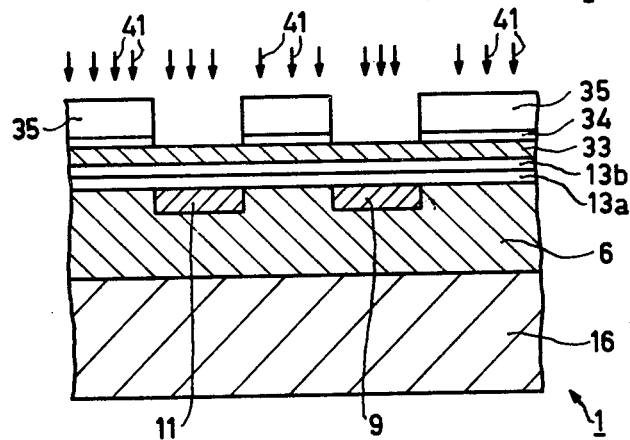

FIG. 20 shows this stage of the process.

Figure 21:
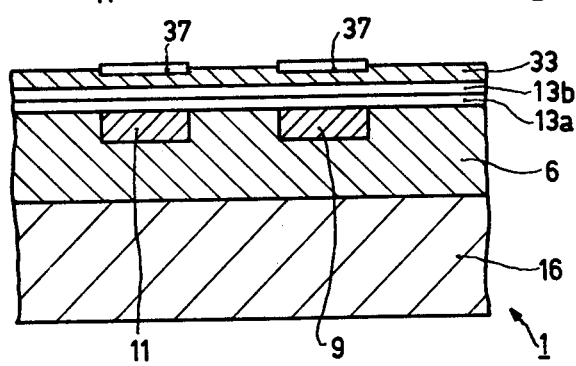

The photolacquer layer 35 may then be removed in known manner, after which the polycrystalline silicon layer 33 is provided with a silicon oxide layer 37 (see FIG. 21) by heating in an oxidizing medium. During said oxidation the silicon layer 33 is masked locally by the remaining parts of the silicon nitride layer 34, so that the silicon layer 33 is provided with an oxide layer 37 only at the area of the word lines 3a, 3b to be formed (so above the zones 9 and 11). The remaining parts of the silicon nitride layer 34 may then be removed again by etching in a phosphoric acid solution. For said etching treatment, in which the oxide layers 37 may not or may substantially not be attacked, no photomasking step is necessary because the (selective) etchant used attacks the nitride much faster than the oxide, as is known. FIG. 21 shows the device in this stage.

The word lines 3a and 3b may then be formed from the polycrystalline silicon layer 33 by locally removing the silicon by etching in, for example, a buffered HNO₃HF solution. During said etching treatment the layer 33 is masked locally by the silicon oxide layers 37.

Figure 22:
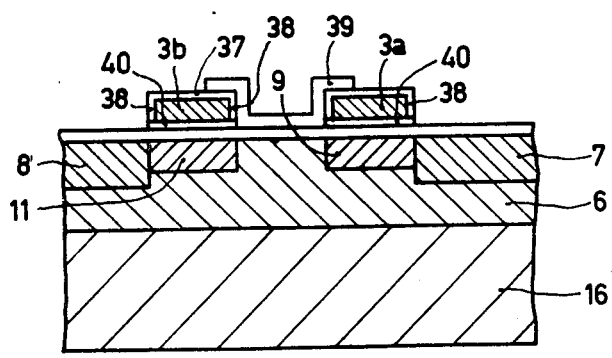

The stripes 3a and 3b are coated on their sides with silicon oxide 38 by means of thermal oxidation of the silicon (FIG. 22). During said oxidation treatment the thickness of the silicon oxide layer 13 will not increase or will at least substantially not increase due to the presence of the silicon nitride layer 13b. The n+ main electrode regions 7, 8 may be provided in a subsequent step. This step may be carried out by implanting donor ions transversely through the silicon nitride layer 13b and the oxide layer 13a in the semiconductor body 1 after first having provided between the word lines 3a and 3b a mask 39 of, for example, a photolacquer layer. However, as shown in FIG. 22, the silicon nitride layer 13b may alternatively be provided first, only parts 40 of the nitride layer 13b below the polycrystalline word lines 3a and 3b remaining. The photomask 39 may then be provided between the paths 3a, 3b. The mask 39 may extend above the paths 3a, 3b so that the provision thereof does not require critical alignment with respect to the paths 3a, 3b. The n+-type zones 7 and 8 may then be provided in a self-registering manner relative to the paths 3a, 3b, for example, by means of implantation of donors through the silicon oxide layer 13a, the body 1 being masked locally by the mask 39 and the paths 3a, 3b. The zones 7, 8 may alternatively be provided by means of diffusion, the oxide layer 13a above the zones 7, 8 to be provided being removed after providing the mask 39: for example by means of so-called dip etching in the case in which the thickness of the oxide layer 13a is much smaller than the thickness of the oxide layers 37 and 38 covering the paths 3a, 3b. After the diffusion, the diffusion windows thus obtained may be closed again.

The zone 8 obtained in this manner extends, just as the zone 11, across the whole matrix, while the zone 7, just as the adjoining zone 9, forms part of a column of zones 7 which are separated from each other by the sunken silicon oxide pattern 14.

The further operations, for example the provision of contact windows in the oxide layers present and the bit lines 4 may be carried out by means of conventionally used methods.

The process described is advantageous in that the word lines 3a, 3b and the underlying p-type zones 9, 11 are defined by means of one and the same mask 35 (see FIG. 9), critical alignment steps being avoided. Besides for devices to which the invention relates, the above described method may generally be used advantageously to manufacture other semiconductor structures comprising a conductor insulated from the semiconductor body and a doped zone which is to be formed in the semiconductor body and which is situated accurately below the conductor.

Figure 23:
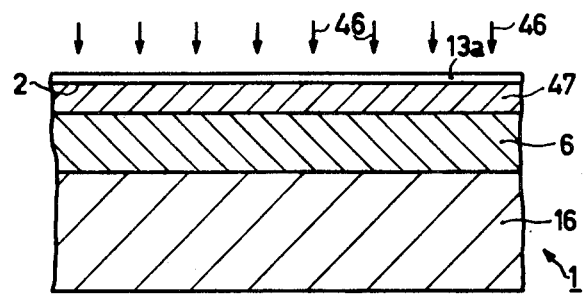
FIGS. 23 to 25 are sectional views of a cell of the device shown in FIG. 9 during a few production stages in which another process is used.

A second method of manufacturing such a structure will be described with reference to FIGS. 23 to 25. These Figures are sectional views corresponding to the sectional views according to FIGS. 19 to 22 of a part of the device during a few stages of the manufacture thereof. There is started from the situation (FIG. 23) in which the semiconductor body 1 comprising the p-type substrate 16 is provided with the n-type surface region 6 and the silicon oxide pattern 14 sunk in the body 1 (and not shown in the Figures). The silicon oxide layer 13a is formed on the surface 2. By means of implantation of boron ions (denoted by the arrows 46), a p-type surface zone 47 is provided extending over the whole n-type surface region 6 of the memory elements.

Figure 24:
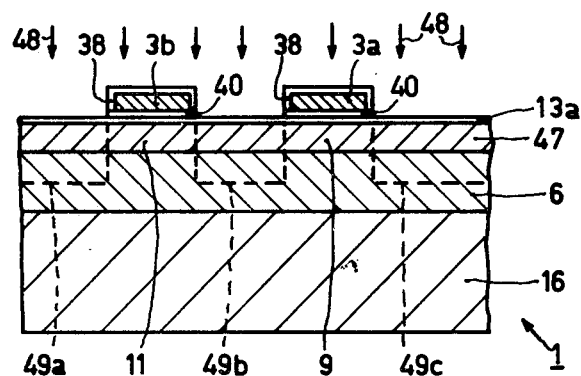
Figure 25:
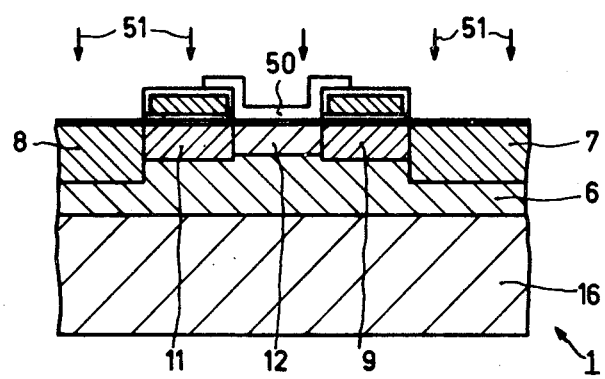

The word lines 3a, 3b of polycrystalline silicon with the underlying silicon nitride layer 40 and the silicon oxide layers 38 covering the lines 3a, 3b are then formed (FIG. 24). While using the word lines 3a, 3b as a doping mask, n-type impurities, for example phosphorus atoms or arsenic atoms, are provided in the semiconductor regions 49a, b, c by means of ion implantation (denoted by the arrows 48 in FIG. 24). The semiconductor regions 49 are shown in broken lines in FIG. 24. The concentration of the implantation is chosen to be so that the surface region 49b between the word lines 3a, 3b has a surface concentration which is desired in connection with the threshold voltage of the IGFET structure (9, 11, 4) to be manufactured. In the present case in which said IGFET is of the so-called depletion type, the concentration is chosen to be so that the p-type impurity in the p-type implanted zone 47 is compensated only partly by the n-type impurity. The p-type zones 9 and 11 which are situated again accurately below the word lines 3a, 3b are obtained from the p-type layer 47 by said doping step.

In a subsequent step (FIG. 25) the region between the word lines 3a, 3b is masked by an implantation mask 50. The mask 50 may be provided, again without being aligned very accurately with respect to the word lines 3a, 3b, in the same manner as the mask 39 in FIG. 22. The n+-type main electrode regions 7 and 8 may then be provided while using the masking effect of the mask 50 and the word lines 3a, 3b by means of implantation of, for example, phosphorus ions (denoted by the arrows 51). As a result of this the structure shown in FIG. 25 is obtained with the n+ main electrode regions 7 and 8, the p-regions 9, 11 and the weakly doped p-type channel region 12 between the regions 9, 11, which regions have been obtained while using the word lines 3a, 3b as a (partial) doping mask.

Figure 10:
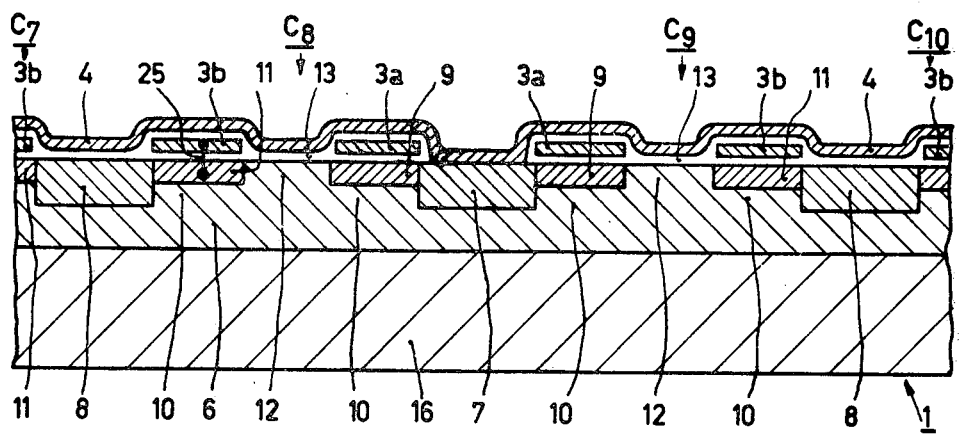
FIG. 10 is a sectional view taken on the line X—X of FIG. 9.
Figure 11:
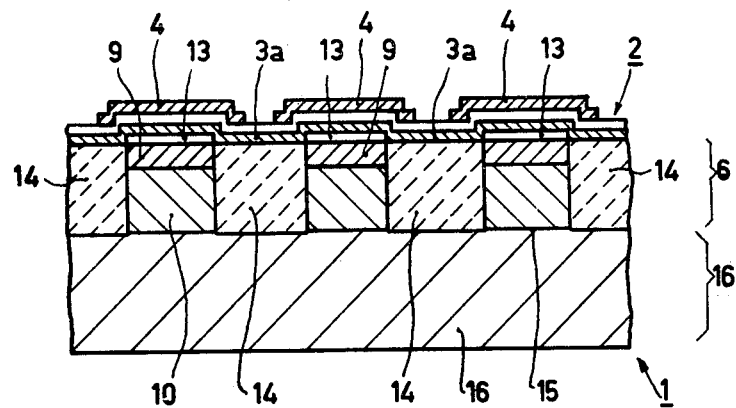
FIG. 11 is a sectional view taken on the line XI—XI of FIG. 9.
Figure 12:
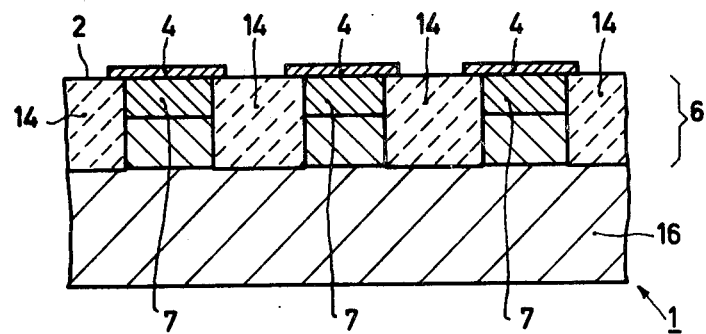
FIG. 12 is a sectional view taken on the line XII—XII of FIG. 9.
Figure 13:
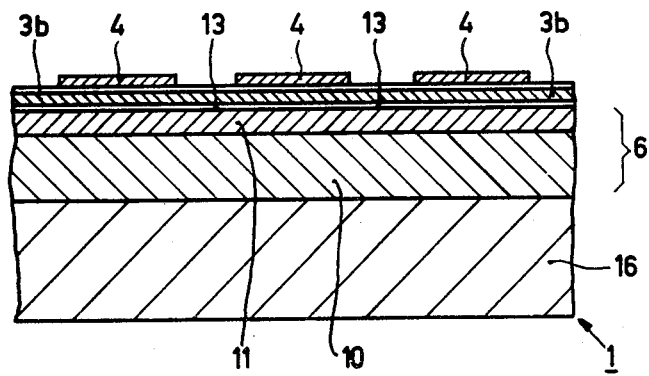
FIG. 13 is a sectional view taken on the line XIII—XIII of FIG. 9.
Figure 26:
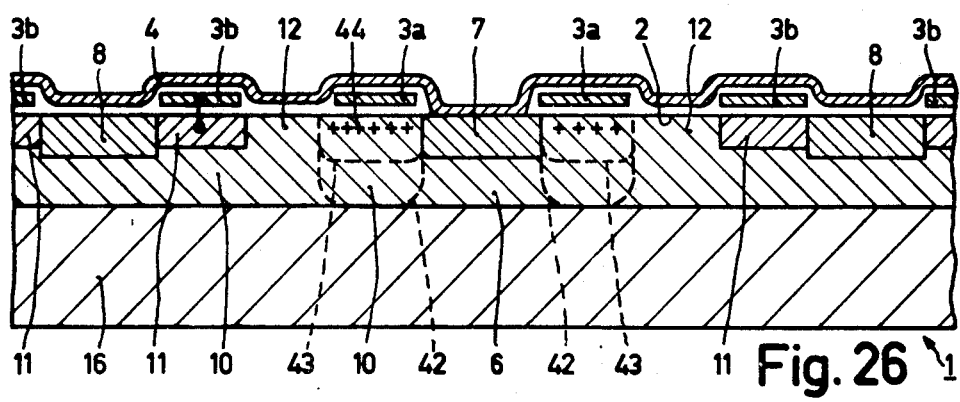
FIG. 26 is a sectional view of a third embodiment of a device according to the invention.

FIG. 26 is a sectional view corresponding to the sectional view shown in FIG. 10 of an embodiment which differs from the preceding embodiment in that instead of p-type doped information-containing regions 9, induced depletion regions 42, 43 form the information-containing regions. In FIG. 26 said regions are shown in broken lines. The depletion regions 42, 43 which can be induced in the underlying n-type part of the surface region 6 by means of the word line 3a again determine the conductivity of the channel 10 between the depletion regions 42, 43 and the substrate 16. In this embodiment the said first field effect transistor which comprises the information actually also is an insulated gate field effect transistor (the gate in this case formed by the word line 3a). The p-type zone 11 which fulfils the functions of source of charge carriers and of word line may also be replaced, if desired, by such an induced region in which an inversion layer which serves as a source of charge carriers can be formed.

The operation of the device is in principle the same as that of the preceding embodiment. Voltages can be applied to the word lines and bit lines 3, 4 which as a function of the time t have the same pattern as the preceding embodiment, albeit that the levels in particular of the clock pulses which are applied to the word line 3a must be slightly adapted, which however, is quite obvious to those skilled in the art. The lowermost level of the voltages at the word line 3a should be chosen to be so low that—in the absence of holes— a depletion region 42 can be formed in the underlying part of the surface region 6 and extends from the surface 2 into the region 6 (and hence into the channel 10) to such an extent that the channel 10 is entirely pinched-off and the transistor is hence blocked. For simplicity a depletion region 42 is shown which extends down to the substrate 16. Holes 44 which become available either via the region 11, or by means of generation, can be stored in the depletion region 43 at the surface 2 and—with the voltage at the word line 3a remaining the same—cause a reduction of the depletion region 43.

Writing, erasing, reading and refreshing of the device may furthermore be carried out in the same manner as in the preceding embodiment. By applying a positive pulse to the word line 3a, holes 44 present are removed; when the negative voltage is then applied again to the word line 3a the depletion region 42 is formed unless the potential of the bit line 4 has such a value (dependent on the information which is to be stored) that the IGFET (43, 10, 4) is open so that holes 44 can flow from the source 10 via the channel region 12 into the depletion region 43 and a depletion region 42 is obtained which does not extend over the whole channel 10.

It will be obvious that the invention is not restricted to the embodiments described but that many variations are possible to those skilled in the art without departing from the scope of this invention. For example, the pinch-off voltages of the first field effect transistors comprising the information may be adjusted at a suitable value by means of the voltage to be applied to the substrate 16. In the first embodiment the p-type zone 11, instead of being set up at a fixed voltage, may also be connected to a clock pulse source so that the zone 11 in this embodiment also may be used for selection purposes. The bit lines 4a, 4b may alternatively be connected by a switch, for example a transistor, instead of by the connection 5. During reading, the connection between the lines 4a, 4b may be interrupted by means of the said switch. In this case reading is performed only on the line 4a. As a result of this the stray capacitances of the bit lines can advantageously be reduced at least during reading.

What is claimed is:

1. A semiconductor device having a semiconductor memory element in particular suitable for use in a random access memory, comprising a semiconductor body having a surface-adjoining surface region of mainly one conductivity type and having a first field effect transistor, which comprises two main electrode regions of one conductivity type having therebetween a channel region of said one conductivity type and a surface situated gate region of opposite conductivity type forming a part of the semiconductor body, by means of which gate region a depletion region extending at least into the channel region can be induced in the semiconductor body, said gate region forming a charge storge region in which information can be stored in the form of electrical charge, which information can be read out nondestructively by determining the conductivity in the channel region between the main electrode regions, characterized in that the memory element comprises a second field effect transistor, which is of the insulated gate variety, and which comprises two main electrode regions one of which is formed by said charge storage region and the other main electrode region is formed by a second surface region of the same conductivity type as said charge storage region, and both main electrode regions of said second field effect transistor being located between the two main electrode regions of said first field effect transistor, the second field effect transistor comprising at least a gate electrode which is insulated from the surface of the semiconductor body and which is coupled electrically to one of the main electrode regions of the first field effect transistor.

2. A semiconductor device as claimed in claim 1, characterized in that one main electrode region of the first field effect transistor is provided with an electrical connection which extends in the form of a conductive layer to at least above the channel region of the second field effect transistor, thereby forming an insulated gate electrode of the second field effect transistor.

3. A semiconductor device as claimed in claim 1, characterized in that the part of the semiconductor body which forms said charge storage region is provided at the surface with a capacitive connection in the form of a conductive region which is separated from the said part of the semiconductor body by a blocking layer.

4. A semiconductor device as claimed in claim 3, characterized in that the blocking layer is formed by a layer of insulating material which is situated at the surface of the semiconductor body and on which the capacitive connection is provided in the form of a conductive layer.

5. A semiconductor device as claimed in claim 1, characterized in that the second main electrode region of the first field effect transistor and forms a second gate electrode region of the first field effect transistor.

6. A semiconductor device as claimed in claim 4, characterized in that the conductive layer which forms the capacitive connection of the part of the semiconductor body which forms said charge storage region extends, viewed on the surface, to beyond said part of the semiconductor body to over a part of the channel region of the second field effect transistor and forms two insulated gate electrodes of the second field effect transistor together with the conductive layer which is connected to one of the main electrode regions of the first field effect transistor and extends above the remaining part of the said channel region of the second field effect transistor.

7. A semiconductor device as claimed in claim 1, characterized in that the second field effect transistor is of the depletion type.

8. A semiconductor device as claimed in claim 1, characterized in that the surface region of mainly one conductivity type is bounded on the side opposite to the surface by a part of the semiconductor body of the second conductivity type.

9. A semiconductor device as claimed in claim 1, characterized in that the first field effect transistor is a function field effect transistor whose gate region which itself forms said charge storage region is separated from the channel region by a rectifying junction.

10. A semiconductor device as claimed in claim 9, characterized in that the gate region is formed by a surface zone of the second conductivity type which is provided in the surface region of one conductivity type and which is coupled at the surface by an insulating layer on which the said electrode forming a capacitive supply for the gate region is provided in the form of a conductive layer.

11. A semiconductor device as claimed in claim 1, characterized in that the gate region of the first field effect transistor is formed by a conductive layer which is separated from the channel region by an intermediate insulating layer, whereby, by means of the insulated gate electrode, an inversion layer can be induced in the underlying channel region and extends from the surface in the channel region and forms the said charge storage region in which information can be stored in the form of minority charge carriers.

12. A semiconductor device as claimed in claim 11, characterized in that the insulated gate electrode of the first field effect transistor is formed by the conductive layer which forms the capacitive connection to the part of the semiconductor body in which the charge storage region can be formed.

13. A semiconductor device comprising a random access memory having a semiconductor body which is provided at a surface with a system of conductors of word lines and bit lines which, at the area of the crossings, are coupled electrically to memory elements provided in an underlying surface region of the semiconductor body of mainly one conductivity type which each comprise a first field effect transistor, having two main electrode regions of one conductivity type and an intermediately located channel region of said one conductivity type and having a surface situated gate region of opposite conductivity type forming a part of the semiconductor body, by means of which gate region a depletion region extending in the channel region can be formed in the semiconductor body said gate region forming a charge storage region in which information can be stored in the form of electrical charge, which information can be read out non-destructively by determining the conductivity in the channel region between said two main electrode regions, said bit lines being coupled to a first main electrode region of the field effect transistors and said word lines being coupled to a gate region of the first field effect transistors, characterized in that each memory element comprises a second field effect transistor which is of the insulated gate type and which comprises two main electrode regions of which one is formed by said charge storage region and the other main electrode region is formed by a second surface region of the same conductivity type as said charge storage region, and both main electrode regions of said second field effect transistor being located between the two main electrode regions of said first field effect transistor, the second field effect transistors each comprising at least one insulating gate electrode which is connected to an associated bit line.

14. A semiconductor device as claimed in claim 13 characterized in that the word lines comprise a number of conductive paths each forming a capacitive connection of the parts of the semiconductor body which during operation form the charge storage regions of the memory elements which are electrically coupled in common to the same word line.

15. A semiconductor device as claimed in claim 13, characterized in that the memory elements, on the sides parallel to the main direction of current of the first field effect transistors, are bounded by dielectric regions extending from the surface over at least a part of the thickness of the semiconductor region of one conductivity type into the semiconductor body.

16. A semiconductor device as claimed in claim 15, characterized in that the dielectric region is formed by an oxide layer obtained by the local oxidation of the semiconductor material of the semiconductor body.

17. A semiconductor device as claimed in claim 16, characterized in that the dielectric regions are formed by stripes which, viewed on the surface, extend mainly parallel to the bit lines and define in the surface region of one conductivity type stripe-shaped islands each comprising the memory elements associated with a bit line which are oriented so that the main direction of current of each of the said first field effect transistors is mainly parallel to the direction in which the bit lines extend.

18. A semiconductor device as claimed in claim 17, characterized in that the stripe-shaped dielectric regions, viewed on the surface, show interruptions by way of which the stripe-shaped surface regions of said opposite conductivity type and adjoining zones of said one conductivity type extend in the semiconductor body in a direction transverse to the bit lines each forming a common second gate electrode region of the second field effect transistors and a common second main electrode region of the first field effect transistors of memory elements associated with the same word line, respectively.

19. A semiconductor device as claimed in claim 18, characterized in that juxtaposed memory elements associated with the same bit line are provided mirror-symmetrically with respect to each other, the first field effect transistors of said juxtaposed memory elements sharing a common main electrode region.

20. A semiconductor device as claimed in claim 14, characterized in that the device comprises a second system of word lines which are each connected to the said other main electrode regions of the second field effect transistors of memory elements associated with the same word, each of said other main electrode regions being formed by a surface zone of said opposite conductivity type which is situated within the channel region of the associated first field effect transistor.

21. A semiconductor device as claimed in claim 13, characterized in that circuit means are present to erase, write and read each memory element, by means of which circuit means, after the erase cycle the gate region of the first field effect transistor of each memory element is brought at a potential at which a depletion region is formed in the semiconductor body and extends into the channel region of the first field effect transistor and forms a charge storage region for storing information-representing electrical charge, by which circuit means, during a write cycle input signals are applied to the insulated gate electrode of the second field effect transistor which is coupled electrically to one of the main electrode regions of the first field effect transistor so that, by way of the second field effect transistor, a quantity of electrical charge determined by the input signal can be introduced into said charge storage region which determines the size of the formed depletion region in the channel region of the first field effect transistor, by which circuit means upon reading, such voltages are applied at least periodically to the main electrode regions of the first field effect transistor that in the given charge state of the charge storage region said insulated gate electrode potential can assume values which correspond to said input signal so that by periodically repeating the erase-write cycle the charge state of the charge storage region can be refreshed periodically.

22. A semiconductor device as claimed in claim 21, characterized in that the input signals can assume two values one of which is larger and the other of which is smaller than the threshold voltage of the second field effect transistor prevailing at the applied voltages.

23. A semiconductor device as claimed in claim 21, characterized in that the depletion region which forms said charge storage region has such an extent, at least in the absence of charge supply by way of the second field effect transistor, that the underlying channel region of the first field effect transistor is pinched-off entirely so that the transistor is switched off.

24. A semiconductor device as claimed in claim 21, characterized in that means are present to switch off the first field effect transistor after information has been written in the charge storage region and to switch on said first field effect transistor when said information should be read out.

25. A semiconductor device as claimed in claim 24, characterized in that the surface zone of the opposite conductivity type which forms said other main electrode region of the second field effect transistor and is situated within the channel region of the first field effect transistor of each memory element is associated with said means by which the first field effect transistor can be switched off independently of the written information and is connected to a voltage source whereby the p-n junction between said surface zone and the channel region of the first field effect transistor can be reversely biased.

* * * * *